United States Patent [19]

Sands

[11] Patent Number: 5,661,763
[45] Date of Patent: Aug. 26, 1997

[54] APPARATUS AND METHOD FOR DETECTING PROGRAMMABLE LENGTH BIT PATTERN IN SERIAL DIGITAL DATA STREAM

[75] Inventor: Jeffrey J. Sands, Huntsville, Ala.

[73] Assignee: Adtran, Inc., Huntsville, Ala.

[21] Appl. No.: 508,589

[22] Filed: Jul. 28, 1995

[51] Int. Cl.$^6$ .................................................. H04L 7/00
[52] U.S. Cl. ..................... 375/368; 375/342; 364/715 H; 371/69.1
[58] Field of Search ..................................... 375/340, 342, 375/354, 365, 368; 364/715.09, 715.11; 371/67.1, 69.1; 382/10, 14; 370/514, 520

[56] References Cited

U.S. PATENT DOCUMENTS

| | | | |
|---|---|---|---|
| 4,414,676 | 11/1983 | Kraul et al. | 375/368 |
| 4,573,171 | 2/1986 | McMahon, Jr. et al. | 375/114 |
| 4,589,142 | 5/1986 | Bednar | 382/37 |
| 4,644,566 | 2/1987 | Vercellotti et al. | 375/94 |
| 4,797,941 | 1/1989 | Lloyd et al. | 382/27 |
| 4,992,954 | 2/1991 | Takeda et al. | 364/518 |
| 5,014,272 | 5/1991 | Yoshida | 370/106 |
| 5,014,327 | 5/1991 | Potter et al. | 382/14 |
| 5,033,101 | 7/1991 | Sood | 382/30 |
| 5,050,224 | 9/1991 | Mori | 382/34 |
| 5,054,104 | 10/1991 | Yamaguchi | 382/57 |
| 5,077,760 | 12/1991 | Lepage | 375/116 |
| 5,109,432 | 4/1992 | Hori | 382/30 |
| 5,121,444 | 6/1992 | Takizawa et al. | 382/30 |
| 5,150,425 | 9/1992 | Martin et al. | 382/14 |
| 5,163,069 | 11/1992 | Hayashi | 375/368 |
| 5,173,695 | 12/1992 | Sun et al. | 341/67 |
| 5,204,883 | 4/1993 | Blanc | 375/116 |
| 5,210,754 | 5/1993 | Takahashi et al. | 370/105.4 |
| 5,212,697 | 5/1993 | Morita | 371/68.1 |
| 5,228,036 | 7/1993 | Okamoto et al. | 370/105.1 |

FOREIGN PATENT DOCUMENTS

WO89/00747  1/1989  WIPO .

*Primary Examiner*—Stephen Chin
*Assistant Examiner*—Amanda T. Le
*Attorney, Agent, or Firm*—Charles E. Wands

[57] ABSTRACT

A programmable digital bit pattern detector detects the presence of a variable length, variable content M-bit serial bit pattern that is sequentially repeated in a digital bit stream during some prescribed time constraint, and indicates whether successive repetitions of the pattern satisfy a prescribed criterion, before declaring that the pattern has been successfully acquired. For this purpose, a variable length shift register is programmed with a copy of the pattern. During initial acquisition, in response to a match between a respective bit of the digital bit stream and the content of a selected stage of the shift register, the contents of the shift register are shifted by one bit stage; in response to a mismatch, clocking of the shift register is inhibited for that bit. Count signals are generated in association with successive pluralities of the M bits of the digital bit stream, and an "up/down" counter is incremented or decremented by the count signals, in accordance with whether successive bits of the digital bit stream match the copy of the bit pattern being clocked through the shift register. A maximum pattern match code representative of a prescribed bit error rate and time interval is programmed into a comparator and is compared with the contents of the "up/down" counter. The comparator generates a 'pattern acquired' output, in response to the value of the "up/down" counter reaching the value of the maximum pattern match code.

28 Claims, 2 Drawing Sheets

APPARATUS AND METHOD FOR DETECTING PROGRAMMABLE LENGTH BIT PATTERN IN SERIAL DIGITAL DATA STREAM

FIELD OF THE INVENTION

The present invention relates in general to digital data communication systems, and is particularly directed to a mechanism for detecting a (sequentially repeated) serial bit pattern in a digital bit stream, where both the contents and the length of the bit pattern are programmable.

BACKGROUND OF THE INVENTION

Digital communication systems, such as digital telecommunication networks, typically employ one or more digital codes or patterns (sequences of digital bits—'1's and '0's) for command, control and/or synchronization purposes. Since the actual contents of any given pattern, its length and the number of times the pattern is repeated within a prescribed repetition interval may vary from system to system, pattern detection circuitry has been conventionally custom-configured to detect a specific pattern and none other. However, as nearly all signal processing subsystems within present day digital communication networks are microcontroller driven, it is desirable that the components of such subsystems not be usage specific, but be programmable, so that they may be capable of serving a wide variety of applications, rather than being limited to one or a few custom functions. For the case of digital pattern detection, therefore, it is desirable that the pattern detection circuitry be user-programmable, so that it may accommodate any pattern of variable content and length, while also allowing for a prescribed bit error rate.

SUMMARY OF THE INVENTION

In accordance with the present invention, this objective is successfully addressed by a programmable digital bit pattern detector which is operative to detect the presence of a variable length, variable pattern serial bit pattern that is sequentially repeated in a digital bit stream during some prescribed time constraint, and to provide an indication of whether successive repetitions of the pattern satisfy a prescribed criterion before declaring that the pattern has been successfully acquired.

For this purpose, the programmable content, programmable length digital pattern detector in accordance with the present invention includes a programmable length, N-stage shift register, which is looped on itself and has its most significant bit stage coupled through a multiplexer to an exclusive OR gate that operates as a bit comparator. The bit comparator compares successive bits of a monitored serial data stream with the pattern that has been programmed into and is controllably circulated through the shift register. The programmed bit contents of the respective stages of the shift register are coupled to an N:1 multiplexer, the output of which is coupled to exclusive OR gate and the serial input of the shift register.

The select inputs of the multiplexer receive an M bit pattern length code, which causes the multiplexer to couple that stage in the shift register associated with the programmed pattern length code to the multiplexer output. As a result of this programmed connection, whenever the shift register is clocked, the shift register is operative to circulate, one stage at the time, an M bit pattern of interest, such as a five bit pattern 11100 through its first M stages, so that five successive shift clock signals effect a complete recirculation or wrap-around of the programmed pattern through the shift register.

The clock signal for shifting the shift register is derived from the output of gate circuit, which controllably inhibits the clocking of the shift register by the recovered data clock in response to pattern bit mismatch and three consecutive pattern mismatches or pattern bit mismatch during a framing bit, but otherwise allows successive clocking of the shift register by the data clock, in order to locate and maintain alignment of the pattern in the data with the pattern recirculated through the shift register.

One input to the gate circuit is derived from a mismatch detect flip-flop of a shift clock control stage, which indicates the occurrence of a mismatch between the data and the pattern as detected by the exclusive OR gate. A second input is coupled to a successive pattern failure counter, in response to the occurrence of a prescribed plurality of sequential pattern match failures after the pattern has been initially detected in the data. A third input is coupled to an exclude framing bit flip-flop of the shift clock control stage, which prevents clocking of the shift register in the event that the current data bit is a framing bit that does not form part of the programmed pattern of interest, so that the framing bit will be ignored, and allow the pattern to be detected exclusive of the framing bit.

The mismatch detect flip-flop is coupled to the clock input of an "up/down" flip-flop, which supplies an "up/down" count control signal to a multi-stage pattern match counter and to a successive pattern failure counter. Once enabled by the "up/down" control signal, the successive pattern failure counter counts output signals from a pattern length counter. If a prescribed number of these consecutive output signals are counted by successive pattern failure counter, it generates a resync signal to resynchronized the pattern detector with the incoming serial data stream.

The pattern length counter is preloaded with the M bits of the pattern length code supplied by the control processor, and is clocked by the recovered data clock. The output from pattern length counter is used to clock a pattern match counter at the pattern repeat rate, with the pattern match counter being controllably incremented or decremented by (carry) output signals from the pattern length counter in accordance with the output of the "up/down" flip-flop. The contents of the pattern match counter are coupled to a maximum pattern match comparator.

The maximum pattern match comparator is coupled to receive a programmable code from the processor representative of a prescribed maximum number of patterns based upon prescribed pattern match and time constraint parameters. The maximum pattern match comparator compares the maximum pattern match code supplied by the control processor with the pattern match count produced by the pattern match counter. Once the pattern has been detected in the data stream, then as long as respective bits of incoming data stream continue to match the successive bits of the pattern being circulated through the shift register, the pattern match counter will continue to be incremented by the pattern length counter (up to maximum pattern match and down to zero, whereupon it stops counting). As the contents of the pattern match counter are incremented for each successive pattern match, its contents are compared with the maximum pattern match code from the control processor.

In response to the contents of the pattern match counter reaching the maximum pattern match value programmed into the comparator corresponding to the expected condition that the incoming data contains a minimum number of successive data patterns (or a prescribed number of pattern repeats with a given time constraint interval), the output of comparator will change state, causing the outputs of the pattern detected flip-flop to change state. This causes the pattern match counter to stop counting, and a flag to be asserted to the processor that the pattern has been successfully acquired.

If, during the course of successive pattern matches after the pattern has been located, an anomaly in the data is detected, the output of the "up/down" flip-flop will cause the pattern match counter to be decremented for that five bit pattern interval. If this mismatch condition occurs over several intervals, it is detected by the successive pattern failure counter, which generates an out-of-sync flag, causing the pattern detector to resynchronize to the serial data stream.

DETAILED DESCRIPTION

Figure 1A:
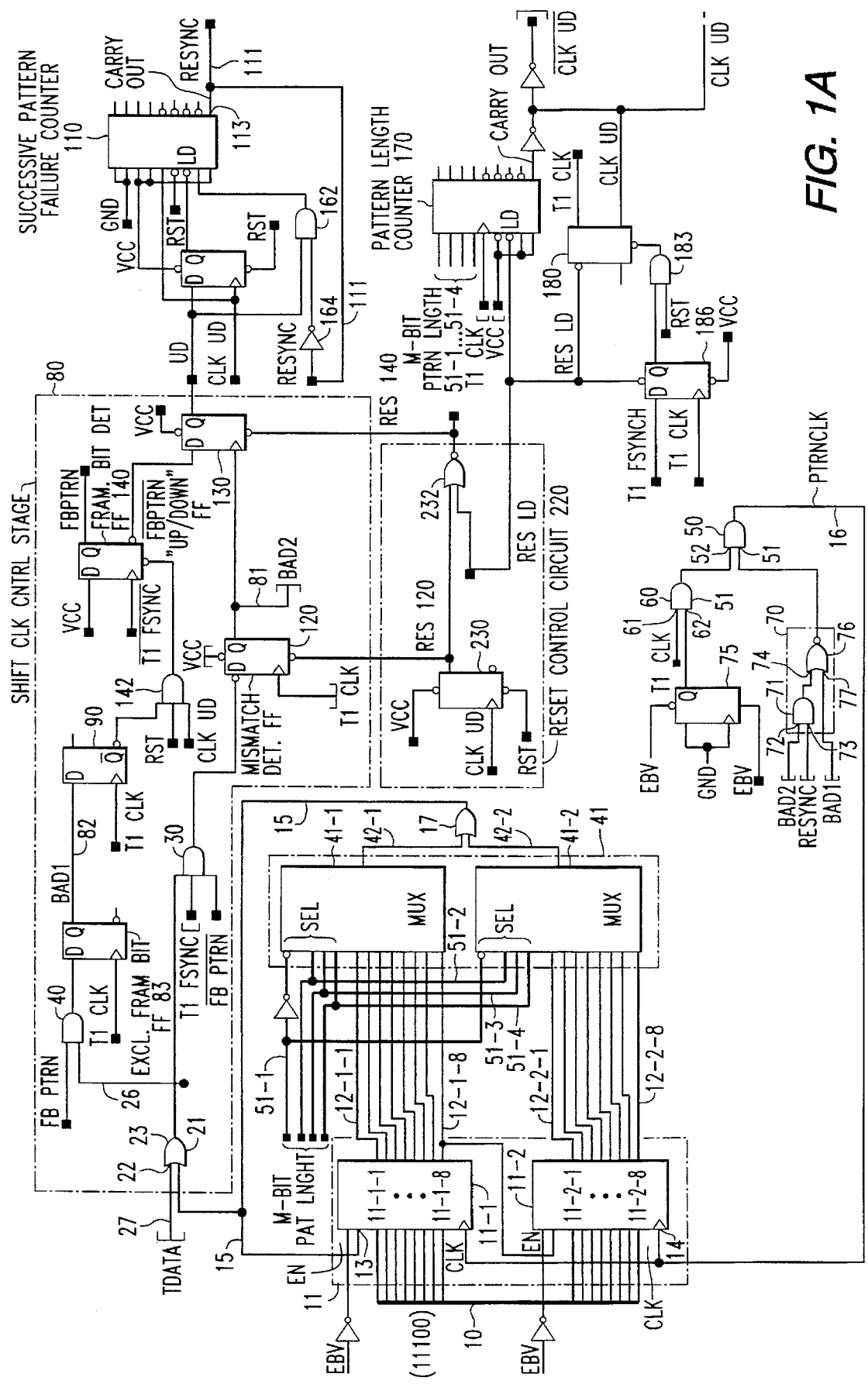
FIGS. 1A and 1B diagrammatically illustrates a programmable content, programmable length digital pattern detector in accordance with an embodiment of the present invention.

Before describing in detail the programmable content, programmable length pattern detection mechanism of the present invention, it should be observed that the present invention resides primarily in what is effectively a prescribed arrangement of conventional digital processing hardware components and attendant supervisory control circuitry therefor, that controls the operations of such components. Consequently, the configuration of such components and the manner in which they are interfaced with other communication equipment of a (digital) telephone network have, for the most part, been illustrated in the drawings by a readily understandable block diagrams, which shows only those specific details that are pertinent to the present invention, so as not to obscure the disclosure with details which will be readily apparent to those skilled in the art having the benefit of the description herein. Thus, the block diagram illustration is primarily intended to show the major components of the system in a convenient functional grouping, whereby the present invention may be more readily understood.

For purpose of providing a non-limiting example, the present invention will be described for the case of a variable length pattern that is programmable up to a total length of sixteen bits. It should be understood, however, that the length of the pattern capable of being detected by a pattern detector configured in accordance with the present invention is not limited to this or any other code length. In addition, the specific pattern chosen in the example described is only for illustrative purposes. The actual bit contents of the pattern, like its length, and also the acceptable bit error rate, are programmable, as will be described. For purposes of illustrating its operation, the pattern detector of the invention will be described in connection with the five bit pattern 11100, as a non-limiting example.

Figure 1B:
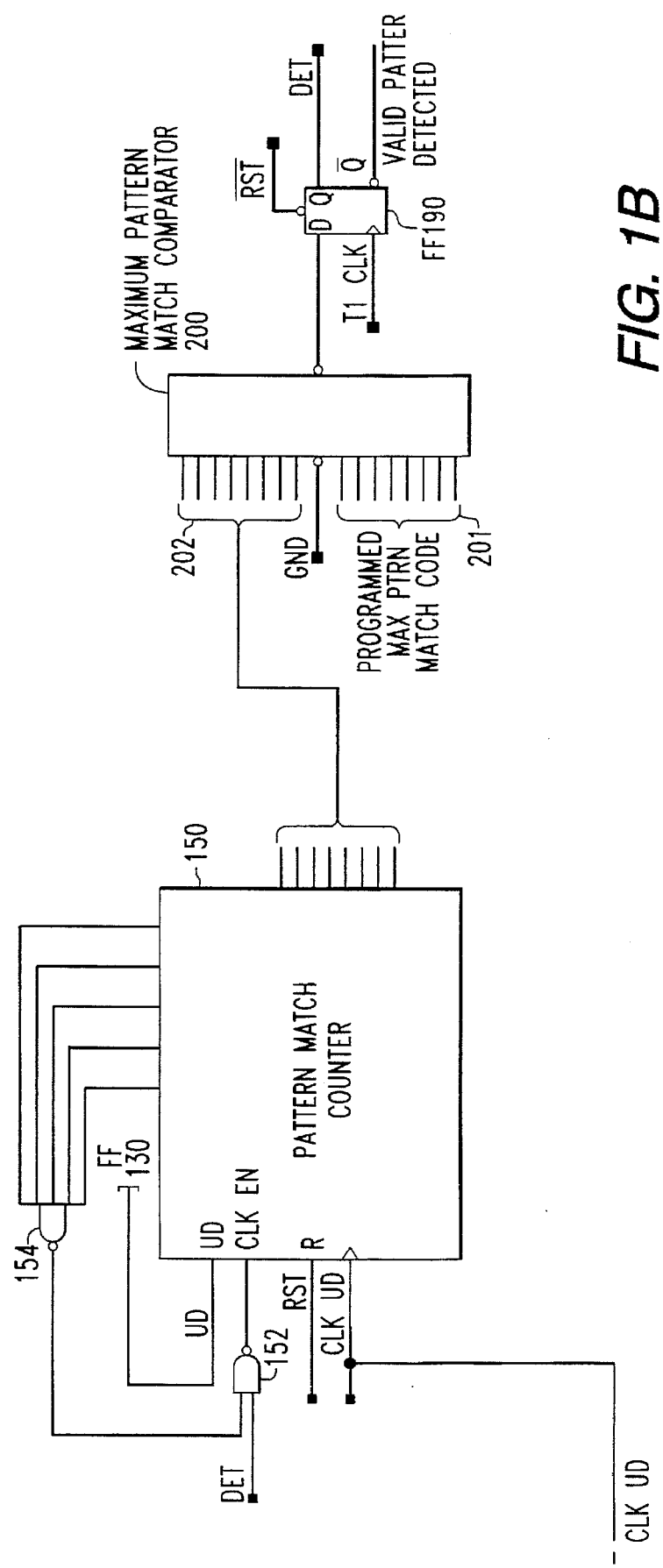

Referring now to FIGS. 1A and 1B, the programmable content, programmable length digital pattern detector in accordance with an embodiment of the present invention is diagrammatically illustrated as comprising a programmable length, N-stage shift register 11 having a serial input port 13, which is coupled via a link 15 to the output of an OR gate 17. Link 15 is further coupled to a first input 21 of an exclusive OR gate 23, which operates as a bit comparator, comparing successive bits of a monitored serial data stream TDATA on link 27 that are applied to its second input 22 with the pattern to be detected, which is stored and controllably circulated through the programmable shift register 11, as will be described. For the non-limiting example of the currently described embodiment of detecting a sequential bit pattern of up to sixteen bits in length (which is sufficient to accommodate the five bit pattern 11100 7252 of the present example), shift register 11 is a sixteen stage register, which may be implemented as a pair of cascaded eight bit shift register sections 11-1 and 11-2, as shown.

The respective stages of each of cascaded eight bit shift register sections 11-1 and 11-2 are coupled to a bus 10, through which a programmable pattern to be detected is loaded by a control processor into the shift register 11. Thus, for the five bit pattern 11100 of the present example, the first five stages 11-1-1 . . . 11-1-5 of eight stage shift register section 11-1 are respectively loaded with the bits 0, 0, 1, 1 and 1. The remaining stages 11-1-6 . . . 11-1-8 of eight stage shift register section 11-1 and the eight stages 11-2-1 . . . 11-2-8 of eight stage shift register section 11-2 are don't cares (and may remain in a reset or cleared state).

The bit contents of the respective stages of shift register sections 11-1 and 11-2 are coupled over links 12-1-1 . . . 12-1-8 and 12-2-1 . . . 12-2-8 to inputs of a pair of multiplexer sections 41-1 and 41-2 of an N:1 multiplexer 41, the outputs of which are coupled over links 42-1 and 42-2 to OR gate 17. In the illustrated example N=16. Multiplexer sections 41-1 and 41-2 have their select inputs coupled via links 51-1 . . . 51-4 to receive an M bit pattern length code which is programmed by the control processor, where $2^M=N$. M is sufficient to accommodate the maximum capacity of the shift register (which is sixteen bits in the present example, so that M=4). Since the particular pattern of the present example (11100) is five bits in length, the M bit code applied via links 51-1 . . . 51-4 to the select inputs of multiplexer 41 is the four bit binary code 0101. The value of the four bit pattern length code on links 51-1 . . . 51-4 to the select inputs of multiplexer 41 causes the multiplexer to couple that stage in shift register 11 associated with the programmed pattern length code to the appropriate multiplexer output 41-1 or 41-2.

In the present example, the four bit pattern length code (0101) on links 51-1 . . . 51-4 to the select inputs of the multiplexer 41 causes the multiplexer to couple the link 12-1-5 from the fifth bit stage 11-1-5 of shift register section 11-1 to the output link 42-1 of multiplexer section 41-1 through OR gate 17, and thereby over link 15 to the serial input 13 of shift register 11. As a result of this programmed connection, whenever the shift register 11 is clocked by a pattern clock signal PTRN CLK applied over link 16 to its clock input 14 from an AND gate 50, which operates as a gated data clock source, to be described, the logical bit value in the fifth stage 11-1-5 of the first shift register section 11-1 will be recirculated through multiplexer section 41-1 and link 15 back to the first stage 11-1-1 of the shift register section 11-1, while the contents of stages 11-1-1 . . . 11-1-4 are respectively transferred to stages 11-1-2 . . . 11-1-5. Namely, when clocked by the pattern clock signal PTRN CLK, shift register 11 is operative to circulate, one stage at the time, the M bit pattern of interest (in the present example, the five bit pattern 11100) through its first M (here, 5) stages. Thus, five successive pattern clock signals of PTRN CLK will effect a complete recirculation or wraparound of the five bit pattern 11100 through the first five stages 11-1-1 . . . 11-1-5 of shift register section 11-1.

The clock signal for shifting the shift register 11—pattern clock signal PTRN CLK—is derived from the output of AND gate 50, which has a first input 51 coupled to the output of an AND gate 60, and a second input 52 coupled to the output of gate circuit 70. AND gate 60 has a first input 61 coupled to a data clock recovery circuit (not shown), which extracts the embedded signal clock, for example, one that is associated with a T1 rate (1.544 MB/s) digital data stream, identified as T1 CLK. AND gate 60 has a second input 62 coupled to the Q output of a flip-flop 75, which is hard set/reset through processor control, allowing shift register 11 to be loaded without being shifted. As will be described, as long as the successive bits of the pattern programmed into the shift register 11 match successive bits of the monitored serial data stream on line 27, AND gate 50 will be enabled, allowing AND gate 60 to clock the shift register 11 at the embedded clock rate T1 CLK of the data received on link 27.

Gate circuit 70, which serves to controllably prevent the clocking of shift register 11, in response to successive pattern mismatches or a mismatch between the contents of the programmed pattern and successive bits of the input data during a framing bit, comprises an AND gate 71 having a first input 72 coupled to receive a BAD2 signal via link 81 from the Q output of a mismatch detect flip-flop 120 of a shift clock control stage 80, and a second input 73 coupled to receive a RESYNC signal via link 111 from the carry output 113 of a successive pattern failure counter 110. The BAD2 signal is generated by flip-flop 120 of the shift clock control stage 80, in response to a respective bit of the monitored serial data failing to match a respective bit of the pattern programmed into shift register 11. The RESYNC signal is generated by successive pattern failure counter 110, in response to the occurrence of a prescribed plurality (three, in the illustrated example) of sequential pattern match failures after the pattern has been initially detected to be present in the data.

The output of AND gate 71 is coupled to the first input 74 of a NOR gate 76, which has a second input 77 coupled to receive a BAD1 signal via link 82 from the Q output of an exclude framing bit flip-flop 83 of shift clock control stage 80. The BAD1 signal serves to prevent clocking of the shift register 11 in the event that the current data bit is a framing bit that does not form part of the programmed pattern of interest, so that the framing bit will be ignored, and allow the pattern to be detected exclusive of the framing bit.

As a non-limiting example, for a typical frame of telecommunication data containing 193 bits, comprised of twenty-four data bytes associated with twenty-four telecommunication channels and a single framing bit, the (193rd) framing bit may customarily not be included as part of a pattern occupying the channel slot bytes, and should be ignored in the course of detecting the pattern. As will be described, the BAD1 signal prevents the clocking of the shift register 11, during the occurrence of such a framing bit in the serial data stream, so as to effectively exclude that framing bit from participating in the pattern detection process.

The output of the data bit-comparing, exclusive OR gate 23 is coupled over link 26 to a first input of AND gate 30 and to a first input of AND gate 40. AND gate 30 has a second input coupled to receive an inverted framing sync signal T1FSYNC BAR from clock/framing recovery circuitry (not shown) and an inverted framing bit signal FBPTRN BAR. The framing bit signal FBPTRN and the inverted framing bit signal FBPTRN BAR are derived from the respective Q and Q BAR outputs of a framing bit detect flip-flop 140, which is clocked by the inverted framing sync signal T1FSYNC BAR. The framing bit signal FBPTRN at the Q output of framing bit detect flip-flop 140 is coupled to the second input of AND gate 40 and serves to inform the shift clock control stage 80 when a framing bit occurs in the data stream.

Namely, whenever the current data bit being received on link 27 is a framing bit that is not part of the pattern of interest, the T1FSYNC clock input to framing bit detect flip-flop 140 will clock a '1' into the Q stage of framing bit detect flip-flop 140, causing the framing bit input to AND gate 40 to go high ('1'); otherwise it is a logical low. Conversely, unless the current data bit being received on link 27 is a framing bit, framing bit detect flip-flop 140 will have been reset by an AND gate 142, which is coupled to the Q BAR output of flip-flop 90, a reset signal RST sourced from the processor and a CLK UD BAR signal, output by a pattern length counter 170, to be described. Flip-flop 90 has its D input coupled via link 82 to the Q output (BAD1) of flip-flop 83, and is clocked by the inverted data clock signal (T1 CLK BAR). The inverted framing bit input FBPTRN BAR to AND gate 30 is normally high; however, upon the occurrence of a framing bit in the data stream, which framing bit is not part of the pattern to be detected, the inverted framing bit input is low. As a consequence, unless the data is a framing bit, the output of AND gate 30 will coincide with the output of exclusive OR gate 23.

The Q output of mismatch detect flip-flop 120, from the Q output of which the BAD2 signal is derived on link 81, as explained above, is coupled to the clock input of an "up/down (U/D)" flip-flop 130, which has its D input coupled to the QBAR output of framing bit detect flip-flop 140. As explained above, framing bit detect flip-flop 140 provides complementary framing bit associated logic levels at its Q and Q BAR outputs, representative of whether the current bit is a framing bit (and therefore not part of the pattern), as indicated by a T1FSYNC signal from framing recovery circuitry (not shown). This allows the pattern detector to ignore or excise framing bits which are not part of the pattern, but may have been injected into the pattern.

The Q output of "up/down" flip-flop 130 supplies an "up/down" count control signal UD, which is coupled to a multi-stage pattern match counter 150, to be described, and to the D input of a flip-flop 160, the Q output of which is coupled to the load input of successive pattern failure counter 110. Successive pattern failure counter 110 has its reset input coupled to the output of an AND gate 162, a first input of which is coupled through inverter 164 to a RESYNC signal line 111, so as to receive the inverted resync signal. As will be described, once enabled by flip-flop 160, successive pattern failure counter 110 is operative to count CLK UD signals from pattern length counter 170. The carry output CLK UD from pattern length counter 170 is further coupled to a reset control circuit 220, including a flip-flop 230, and associated OR gate 232, which supplies reset signals RES 120, RES 140 to the reset inputs of flip-flops 120 and 140, respectively of the shift control logic stage 80.

If a prescribed number (e.g. three) of consecutive CLK UD signals are counted by successive pattern failure counter 110, the carry output RESYNC of successive pattern failure counter 110 on line 111 goes high, so that both the BAD2 and RESYNC inputs to AND gate 71 of gate circuit 70 go high, which causes the output of NOR gate 76 and thereby the output of gate circuit 70 to go low, disabling AND gate 50 and inhibiting the clocking of shift register 11. A second input of AND gate 162 is coupled to receive the UD signal produced at the Q output of flip-flop 130 of the shift clock control section 80. Pattern length counter 170 is preloaded with the M bits of the pattern length code supplied by the links 51-1 . . . 51-4 from the control processor, and is clocked by the recovered data clock T1 CLK. It is loaded by a preload signal output by a flip-flop 180, which is coupled to receive the inverted carry output CLK UD of counter 170, and is clocked by the inverted recovered clock signal T1 CLK BAR. Flip-flop 180 is controllably reset by the output of an AND gate 183, which has a first input coupled to the Q output of a flip-flop 186, and a second input coupled to receive the reset signal RST. Flip-flop 186 has its D input coupled to receive the frame sync signal T1FSYNC, and is clocked by the recovered data clock T1 CLK.

A bit maximum pattern match comparator 200 has a first set of inputs 201 coupled to receive a code from the processor bus representative of a prescribed maximum pattern match, and a second set of inputs 202 coupled to a prescribed number (e.g. eight) of the most significant bit stages of multi-stage pattern match counter 150. Maximum pattern match comparator 200 is operative to compare the maximum pattern match value supplied by the control processor with the pattern match count produced by pattern match counter 150, as the input data is compared with the pattern of interest. As will be described, once the bit pattern of interest that has been programmed into the shift register 11 is acquired, the lack of or the presence of pattern errors in the data stream cause the contents of the pattern match counter 150 to be respectively incremented or decremented, by the UD produced by the shift clock control stage 80 and the CLK UD signals produced by the pattern length counter 170, in association with the pattern quality of the data stream being monitored. The respective stages of pattern match counter 150 are controllably disabled by the output of a NAND gate 152, which is coupled to the output of a NAND gate 154 which receives carry outputs of the respective stages of pattern match counter 150, and a valid pattern detected signal DET from the Q output of a valid pattern detected flip-flop 190. Valid pattern detected flip-flop 190 has its D input coupled to the compare output 191 of maximum pattern match comparator 200, and its clock input coupled to receive the recovered data rate clock T1 CLK.

OPERATION

In the course of system initialization, with all counters and flip-flops reset, the pattern detector's control processor will have loaded the pattern to be detected (in the present example, the five bit pattern 11100) into the shift register 11 via bus 10. Specifically, as pointed out previously, the first five stages 11-1-1 . . . 11-1-5 of eight stage shift register section 11-1 will be loaded with the respective bits 0, 0, 1, 1 and 1. (The remaining stages 11-1-6 . . . 11-1-8 of eight stage shift register section 11-1 and the eight stages 11-2-1 . . . 11-2-8 of eight stage shift register section 11-2 do not participate in the operation of the pattern detector and remain in a reset or cleared state).

The processor also supplies a prescribed maximum pattern match representative code via links 201 to comparator 200. This code is based upon prescribed bit error rate and time constraint parameters as follows. The digital code value REG loaded via links 201 into comparator 200 is defined as:

$REG=P*EP,$ where $P=t(f)/N,$ and $EP=BER(1-N).$

In the above equations,
BER=bit error rate,
t=the time constraint (e.g. some number of seconds),
N=the pattern length (e.g. five bits), and
f=the data rate (e.g. T1=1.544 MB/s).

In addition, as described previously, a four bit binary code representative of the length of the pattern (0101 for the five bit pattern of the present example) is supplied from the control processor over links 51-1 . . . 51-1 to each of the select inputs of multiplexer 41 and the preloaded into pattern length counter 170. In the present example, multiplexer section 41-1, to which the fifth bit-associated stage 11-1-5 of the shift register 11 is coupled via line 12-1-5, connects the most significant bit position of the pattern (which is the fifth bit in the present example) on line 12-1-5 to output 41-1, so that the length of the shift register is effectively reduced to five bit stages. As a result, the five bit pattern that has been loaded into the five stages 11-1-1 . . . 11-1-5 of the first shift register section 11-1 will be recirculated through multiplexer section 41-1, OR gate 17, link 15 and back into the first stage of the shift register 11-1, in response to the shift register being sequentially clocked by the pattern clock signal PTRN CLK applied to its clock input 14 from AND gate 50.

As incoming serial data is clocked over link 27, each successive data bit is applied to input 22 of exclusive OR circuit 23 and compared with whatever bit is currently resident in the most significant bit stage of the programmed shift register 11 (stage 11-1-5, in the present example), as output on line 15 from OR gate 17, and applied to input 21 of exclusive OR circuit 23. Whenever these two bits match, the output of exclusive OR circuit 23 on line 26 is a logical '0' bit; whenever these two bits fail to match, the output of exclusive OR circuit 23 on line 26 is a logical '1' bit.

Assuming that the current data bit on line 27 is not a framing bit that is separate from (not part of) the pattern (namely, the framing sync logic level T1FSYNC on the input data line does not transition from a non-framing bit state to a framing bit state that would clock framing bit flip-flop 140), then the framing bit input FBPTRN to AND gate 40 will also be a '0'. In either case, the output of AND gate 40 will be a '0'. Thus, for the case of a match between the data bit and the contents of the shift register's MSB stage 11-1-5, as detected by exclusive OR gate 23, then coincident with the recovered data clock T1 CLK, the Q output of the exclude framing bit flip-flop 83 (BAD 1) goes low ('0'), causing the first input 77 (BAD1) of NOR gate 76 within gate circuit 70 to be a '0'.

Similarly, for the case of the data bit not being a framing bit, each of the inverted version of the frame sync input T1FSYNC and the inverted framing bit FBPTRN BAR inputs to AND gate 30 is a '1'. However, since exclusive-OR gate 23 detects a match between the data bit and the current contents of the most significant bit (MSB) stage 11-1-5 of the shift register 11, its output is a logical '0', so that its input to AND gate 30 will be '0', causing a '0' to be clocked out of the Q output (BAD2) of mismatch flip-flop 120. Therefore, the BAD2 input to AND gate 71 of gate circuit 70 is a '0', so that the output of AND gate 71, which is applied to the second input 74 of NOR gate 76, is a '0'. Consequently, both inputs 74 and 77 to NOR gate 76 of gate circuit 70 are '0', so that its output applied to the second input 52 of AND gate 50 is a '1', thereby enabling the input 52 of AND gate 50, whereby the data clock signal T1 CLK is allowed to pass through AND gate 50 to shift clock line 16.

Thus, in the case of a match between a respective data bit and the MSB stage 11-1-5 of shift register 11, and excluding framing bit participation, as described above, the output of AND gate 50 produces the shift clock signal PTRN CLK coincident with the data clock T1 CLK, so as to clock the shift register 11, and shift its contents by one bit stage. As long as the successive bits of the pattern (11100) stored in the shift register 11 match successive bits of the data being clocked over link 27, the T1 CLK signal input to AND gate 60 and output thereby to AND gate 50 causes the output of the AND gate 50 to generate the shift clock signal PTRN CLK, which is applied over line 16 to the clock input 14 of shift register 11, thereby clocking/shifting the shift register 11 at the embedded (T1) clock rate.

As noted above, for the (customary) case where the data bit does not correspond to a framing bit that is not part of the pattern (11100), then when the data bit matches the contents of the shift registers MSB stage (here, 11-15), the Q output (UD) of "up/down" flip-flop 130 will be a logical '1'. This "up/down" count control logic level is coupled to a multi-stage pattern match counter 150, and to the D input of a flip-flop 160, each of which is clocked by the pattern length count clock signal CLK UD generated by pattern length counter 170. With pattern length counter 170 preloaded with the (M=5) bit pattern length code supplied by the links 51-1 ... 51-4 from the control processor, then, as it is clocked by the data clock T1 CLK, it will count down or decrement from the loaded value of M. Eventually, for five successive data clocks, corresponding to five data bits, counter 170 will count down to zero and roll over, thereby generating the count-to-M clock CLK UD (where M=5, in the present example). This carry-based clock signal CLK UD will cause the contents of the pattern match counter 150 to be either incremented or decremented, depending upon the logical state of the UD output of "up/down" flip-flop 130.

If a respective data bit on data link 27 fails to match the bit currently resident in the most significant bit stage of the programmed shift register 11, then the output of exclusive OR circuit 23 will be a logical '1' bit. Therefore, for the present case of the data bit not being a framing bit that forms part of the pattern, each of the inputs to AND gate 30 will be a '1', so that the output of AND gate 30 is a '1'. As a result, a '1' will be clocked into mismatch flip-flop 120, whereby its Q output (BAD2) will transition to '1', which is applied to the clock input of "up/down" flip-flop 130 and to the input 72 of AND gate 71 of gate circuit 70.

When the RESYNC input 73 is a 0, indicating that three consecutive pattern mismatches have not occurred, input 72 of AND gate 71 will have no effect on PTRN CLK. If the RESYNC input 73 to AND gate is a '1', the output of AND gate 71 will be a '1', causing the output of NOR gate 76 to go low ('0') so that the second input 52 of AND gate 50 is a '0', thereby disabling AND gate 50. As a consequence, the output of AND gate 50 is inhibited from producing the shift clock signal PTRN CLK in accordance with the data clock T1 CLK, so that the shift register 11 is not clocked. In this manner, shift register 11 is selectively clocked in accordance with whether or not a respective data bit matches the current contents of the most significant bit stage 11-1-5 of shift register 11, allowing resynchronization with the pattern. This continues until a pattern match is achieved.

In addition, the occurrence of a low to high (BAD2) transition at the clock input to "up/down" flip-flop 130 causes flip-flop 130, which had been previously reset, at the beginning of a respective five bit count interval carried out by pattern length counter 170, to be loaded with the logical '1' at the Q output of "up/down" flip-flop 130. This latching of a '1' bit into "up/down" flip-flop 130 during a respective five data bit count interval indicates that a pattern mismatch (pattern bit error) has occurred in the data for that count interval, which will cause the pattern match counter 150, once enabled, to be decremented for that five bit interval by the pattern count carry clock signal CLK UD generated by pattern length counter 170, and allows successive pattern failure counter 110 to be incremented.

Eventually, as the shift register 11 is selectively clocked in response to comparisons between successive bits of data and the programmed pattern (assuming that the data contains some number of repetitions of the pattern within a time constraint interval, as described above), the Q output of mismatch detect flip-flop 120 will remain low for five successive bits of a five bit interval counted by pattern length counter 170, so that "up/down" flip-flip 130 will not have been clocked by a low-to-high transition (BAD2=1), so that its Q output will still be a '0' at the time of the generation of the CLK UD signal by pattern length counter 170. As a consequence, pattern match counter 150 will be incremented by the CLK UD signal generated by pattern length counter 170.

Thereafter, as long as respective bits of incoming data stream on link 27 continue to match the successive bits of the pattern being circulated through shift register 11, the Q output of "up/down" flip-flip 130 will remain low or '0' at the time of the generation of each successive CLK UD signal by pattern length counter 170. Pattern match counter 150 will be therefore continue to be incremented by the CLK UD signal generated by pattern length counter 170, and successive pattern failure counter 110 will be held in reset. As the contents of pattern match counter 150 are incremented for each successive pattern match, the eight MSB contents on inputs 202 to maximum pattern match comparator 200 are compared with the maximum pattern match code applied to its inputs 201 from the control processor, and defined in accordance with the equations set forth above. Conversely, should there be an anomaly in the data, causing the Q output of "up/down" flip-flip 130 to be high at the end of a pattern count interval, pattern match counter 150 will be decremented for that interval, and successive pattern failure counter 110 will be incremented.

For the expected condition that the incoming data contains a minimum number of successive data patterns (or a prescribed number of pattern repeats with a given time constraint interval) then eventually, as the pattern match counter 150 continues to be incremented in response to successive pattern matches, the output of maximum pattern match comparator 200 will change state, causing the Q and Q BAR outputs of valid pattern detected flip-flop 190 to change state. The Q output of valid pattern detected flip-flop 190 is coupled to NAND gate 152, so as to enable or disable the pattern match counter 150 clock, while the Q BAR output of pattern detected flip-flop 190 provides a flag to the processor that the pattern has been successfully acquired.

As noted earlier, during successive pattern matches, the Q output of "up/down" flip-flip 130 will remain low or '0' at the time of the generation of each successive CLK UD signal by pattern length counter 170, and pattern match counter 150 will continue to be incremented by the CLK UD signal generated by pattern length counter 170 . However, if the data contains an anomaly, the Q output of "up/down" flip-flip 130 will be high at the end of a pattern count interval, causing pattern match counter 150 to be decremented for that interval. If this mismatch condition occurs over several intervals, it may be inferred that the pattern detector has lost pattern sync, and should be restarted (resynchronized).

To detect this loss of sync condition, the Q output of "up/down" flip-flop 130 is monitored by successive pattern failure counter 110, which is clocked by the CLK UD signal produced by the pattern length counter 170, and the load input of which is coupled to the Q output of flip-flop 160, as described previously. When the "up/down" logic level at the Q output of "up/down" flip-flop 130 is indicative of a pattern bit error condition (BAD2='1'), successive pattern failure counter 110 begins counting CLK UD signals until reset by a change in the UD logic level to a zero. If a predetermined number (e.g. three) of consecutive CLK UD signals are counted by successive pattern failure counter 110, the carry output RESYNC of successive pattern failure counter 110 on line 111 goes high, so that both the BAD2 and RESYNC inputs to AND gate 71 are high, which causes the output of NOR gate 76 and thereby the output of gate circuit 70 to go low, disabling AND gate 50 and inhibiting the clocking of shift register 11.

As will be appreciated from the foregoing description, the present invention satisfies the above-described objective of a programmable pattern detector that is capable of serving a wide variety of applications, rather than being limited to one or a few custom functions, being user-programmable, so that it may accommodate any pattern of variable content and length, while also allowing for a prescribed bit error rate. Advantageously, the programmable digital bit pattern detector is capable of detecting the presence of a variable length, variable pattern serial bit pattern that is sequentially repeated in a digital bit stream during a prescribed time constraint, and provides an indication of whether successive repetitions of the pattern satisfy a prescribed criterion before declaring that the pattern has been successfully acquired.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A digital bit pattern detector for detecting the presence of an M-bit serial bit pattern in a digital bit stream comprising:

a shift register, which stores a copy of said M-bit serial bit pattern, and is operative to sequentially recirculate said copy of said M-bit serial bit pattern therethrough, in response to shift clock signals applied thereto;

a bit comparator which is coupled to compare respective bits of said digital bit stream with the content of a selected bit stage of said shift register;

a shift clock control signal generator which is operative to selectively supply shift clock signals to said shift register, in accordance with whether said bit comparator indicates that a respective bit of said digital bit stream matches the content of a selected bit stage of said shift register;

a pattern length counter which is operative to generate count signals in association with successive pluralities of M data bits of said digital bit stream;

a pattern match counter, contents of which are controllably modified by said count signals generated by said pattern length counter, in accordance with whether said bit comparator indicates that a respective bit of said digital bit stream matches the content of a selected bit stage of said shift register; and a pattern match comparator which is coupled to compare a pattern match code representative of a prescribed pattern match value with contents of said pattern match counter, and which provides an output representative of detection of said M-bit serial bit pattern, in response to the contents of said pattern match counter satisfying a prescribed relationship with respect to said pattern match code.

2. A digital bit pattern detector according to claim 1, wherein said M-bit serial bit pattern is successively repeated in said digital bit stream, and further including a successive pattern failure counter, which is operative to generate a loss of pattern signal, in response to a pattern mismatch in a prescribed number of successive M-bit sequences of data bits.

3. A digital bit pattern detector according to claim 2, further including a counter modification control circuit, which is operative to cause said pattern match counter to be selectively incremented or decremented by a count signal generated by said pattern length counter, in accordance whether said bit comparator indicates that a respective plurality of M data bits of said digital bit stream matches said copy of said M-bit serial bit pattern.

4. A digital bit pattern detector according to claim 3, wherein said counter modification control circuit is coupled to said successive pattern failure counter and is operative to cause said successive pattern failure counter to generate said loss of pattern signal, in response to a pattern mismatch in said prescribed number of successive M-bit sequences of data bits.

5. A digital bit pattern detector according to claim 1, wherein said shift clock control signal generator is operative to selectively prevent a respective shift clock signal from being supplied to said shift register, in accordance with whether a respective bit of said digital bit stream is a framing bit that does not form part of said M-bit serial bit pattern.

6. A digital bit pattern detector according to claim 1, wherein said shift register comprises a programmable length N-bit shift register, which stores said copy of said M-bit serial bit pattern in Ith through (I+M)th bit stages thereof that are serially looped through an N:1 multiplexer to an Ith stage serial input and coupled to said bit comparator, said N:1 multiplexer having select inputs thereof coupled to receive a pattern length code, in response to which said N:1 multiplexer couples said Mth bit stage of said N-bit shift register identified by said pattern length code to said bit comparator.

7. A digital bit pattern detector according to claim 1, wherein said shift clock control signal generator comprises a digital signal processing logic circuit, which is coupled to receive a bit rate clock signal associated with the bit rate of said digital bit stream, and is operative to supply said shift clock signal to said shift register in accordance with said bit rate clock signal, in dependence upon whether said bit comparator indicates that a respective bit of said digital bit stream matches the content of said selected bit stage of said shift register.

8. A digital bit pattern detector according to claim 7, wherein said logic circuit is operative to controllably inhibit the clocking of said shift register in accordance with said bit rate clock signal, in response to a mismatch between a bit of said copy of said M-bit serial bit pattern and a respective bit of said digital bit stream, but otherwise allows successive clocking of said shift register in accordance with said bit rate clock signal, so as to controllably shift contents of said shift register into alignment with successive bits of said M-bit serial bit pattern in said digital bit stream.

9. A digital bit pattern detector according to claim 8, wherein said digital signal processing logic circuit is further operative to selectively prevent a respective shift clock signal from being supplied to said shift register, in accordance with whether a respective bit of said digital bit stream is a framing bit that does not form part of said M-bit serial bit pattern.

10. A digital bit pattern detector according to claim 1, wherein said pattern length counter is coupled to be preloaded with an M bit pattern length code and is clocked by a bit rate clock signal associated with the bit rate of said digital bit stream, and is operative to clock said pattern match counter at the pattern repeat rate, said pattern match counter being controllably incremented or decremented by output signals from the pattern length counter in accordance with whether said bit comparator indicates that a respective bit of said digital bit stream matches the content of said selected bit stage of said shift register.

11. A digital bit pattern detector according to claim 10, wherein said pattern match comparator is coupled to store said programmable pattern match value, which is continuously compared with the contents of said pattern match counter, and wherein said pattern match counter is operative such that, as long as respective bits of said digital bit stream continue to match successive bits of said copy of said M-bit pattern being circulated through said shift register, said pattern match counter is successively incremented by said pattern length counter, and wherein, in response to the contents of said pattern match counter reaching the value of said programmable pattern match value, said pattern match comparator generates an output representative of detection of said M-bit serial bit pattern.

12. A digital bit pattern detector for detecting an M-bit serial bit pattern, which is successively repeated in a digital bit stream, comprising:

a shift register, which stores a copy of said M-bit serial bit pattern, and is operative to sequentially recirculate said copy of said M-bit serial bit pattern therethrough, in response to shift clock signals applied thereto;

a bit comparator which is coupled to compare respective bits of said digital bit stream with the content of a selected bit stage of said shift register;

a pattern length counter which is operative to generate count signals in association with successive pluralities of M data bits of said digital bit stream;

a successive pattern failure counter, which is operative to generate a loss of pattern signal, in response to a pattern mismatch in a prescribed number of successive M-bit sequences of data bits; and a shift clock control signal generator which is coupled to said bit comparator and to said successive pattern failure counter, and is operative to supply said shift clock signals to said shift register, so as to cause said copy of said M-bit serial bit pattern being recirculated through said shift register to be in synchronization with said M-bit serial bit pattern repeated in said digital bit stream, but to controllably inhibit the application of said shift clock signals to said shift register, in response to a predetermined number of pattern mismatches in a prescribed number of successive M-bit sequences of data bits.

13. A digital bit pattern detector according to claim 12, further including a pattern match counter, contents of which are controllably modified by said count signals generated by said pattern length counter, in accordance with whether said bit comparator indicates that a respective bit of said digital bit stream matches the content of a selected bit stage of said shift register; and a pattern match comparator which is coupled to compare a pattern match code representative of a prescribed pattern match value with contents of said pattern match counter, and which provides an output representative of detection of said M-bit serial bit pattern, in response to the contents of said pattern match counter satisfying a prescribed relationship with respect to said pattern match code.

14. A digital bit pattern detector according to claim 13, further including a counter modification control circuit, which is operative to cause said pattern match counter to be selectively incremented or decremented by a count signal generated by said pattern length counter, in accordance whether a respective plurality of M data bits of said digital bit stream matches said copy of said M-bit serial bit pattern.

15. A digital bit pattern detector according to claim 14, wherein said counter modification control circuit is coupled to said successive pattern failure counter and is operative to cause said successive pattern failure counter to generate said loss of pattern signal, in response to a pattern mismatch in said prescribed number of successive M-bit sequences of data bits.

16. A digital bit pattern detector according to claim 13, wherein said pattern match comparator is coupled to store a programmable pattern match value, which is continuously compared with the contents of said pattern match counter, and wherein said pattern match counter is operative such that, as long as respective bits of said digital bit stream continue to match successive bits of said copy of said M-bit pattern being circulated through said shift register, said pattern match counter is successively incremented by said pattern length counter, and wherein, in response to the contents of said pattern match counter reaching the value of said programmable pattern match value, said pattern match comparator generates an output representative of detection of said M-bit serial bit pattern.

17. A digital bit pattern detector according to claim 12, wherein said shift clock control signal generator is operative to selectively prevent a respective shift clock signal from being supplied to said shift register, in accordance with whether a respective bit of said digital bit stream is a framing bit that does not form part of said M-bit serial bit pattern.

18. A digital bit pattern detector according to claim 12, wherein said shift register comprises a programmable length N-bit shift register, which stores said copy of said M-bit serial bit pattern in Ith through (I+M)th bit stages thereof that are serially looped through an N:1 multiplexer to an Ith stage serial input and coupled to said bit comparator, said N:1 multiplexer having select inputs thereof coupled to receive a pattern length code, in response to which said N:1 multiplexer couples said Mth bit stage of said N-bit shift register identified by said pattern length code to said bit comparator.

19. A digital bit pattern detector according to claim 12, wherein said shift clock control signal generator comprises a digital signal processing logic circuit, which is coupled to receive a bit rate clock signal associated with the bit rate of said digital bit stream, and is operative to supply said shift clock signal to said shift register in accordance with said bit rate clock signal, in dependence upon whether said bit comparator indicates that a respective bit of said digital bit stream matches the content of said selected bit stage of said shift register, and to controllably inhibit the application of said shift clock signals to said shift register, in response to said predetermined number of pattern mismatches in said prescribed number of successive M-bit sequences of data bits.

20. A method of detecting the presence of an M-bit serial bit pattern which is sequentially repeated over a prescribed repetition interval within a digital bit stream comprising the steps of:

(a) programming a shift register with a copy of said M-bit serial bit pattern, and controllably shifting said copy of said M-bit serial bit pattern over a recirculation path through said shift register;

(b) comparing respective bits of said digital bit stream with the content of a selected bit stage of said shift register;

(c) in response to step (b) indicating a match between a respective bit of said digital bit stream and the content of said selected bit stage of said shift register, causing step (a) to shift said copy of said M-bit serial bit pattern by one bit stage through said shift register, but in response to step (b) indicating a mismatch between a respective bit of said digital bit stream and the content of said selected bit stage of said shift register, inhibiting step (a) from shifting said copy of said M-bit serial bit pattern through said shift register, (d) generating successive count signals in association with successive pluralities of M data bits of said digital bit stream;

(e) controllably modifying a variable count by said count signals generated in step (d), in accordance with whether step (b) indicates that a respective bit of said digital bit stream matches the content of a selected bit stage of said shift register; and (f) comparing a pattern match code representative of a prescribed bit error rate and time interval with said variable count, and generating an output representative of detection of said M-bit serial bit pattern, in response to the value of said variable count satisfying a prescribed relationship with respect to said pattern match code.

21. A method according to claim 20, further including the step of:

(g) generating a loss of pattern signal, in response to a pattern mismatch in a prescribed number of successive M-bit sequences of data bits.

22. A method according to claim 20, wherein step (a) further includes selectively preventing the shifting of the contents of said shift register, in response to a respective bit of said digital bit stream being a framing bit that does not form part of said M-bit serial bit pattern.

23. A method according to claim 20, wherein step (e) further comprises selectively incrementing or decrementing variable count, in accordance whether step (b) indicates that a respective plurality of M data bits of said digital bit stream matches said copy of said M-bit serial bit pattern.

24. A method according to claim 20, wherein said shift register comprises a programmable length N-bit shift register, which stores said copy of said M-bit serial bit pattern in Ith through (I+M)th bit stages thereof that are serially looped through an N:1 multiplexer to an Ith stage serial input, said N:1 multiplexer having select inputs thereof coupled to receive a copy of said M-bit serial bit pattern, in response to which said N:1 multiplexer couples said Mth bit stage of said N-bit shift register identified by said copy of said M-bit serial bit pattern to an output thereof for comparison with said digital bit stream in step (b).

25. A method according to claim 20, wherein step (c) comprises controlling the generation of shift clock signal for said shift register in accordance with a bit rate clock signal associated with the bit rate of said digital bit stream, and in dependence upon whether a respective bit of said digital bit stream matches the content of said selected bit stage of said shift register.

26. A method according to claim 25, wherein step (c) comprises controllably inhibiting the clocking of said shift register in accordance with said bit rate clock signal, in response to a mismatch between a bit of copy of said M-bit serial bit pattern and a respective bit of said digital bit stream, but otherwise clocking said shift register in accordance with said bit rate clock signal, so as to controllably shift said copy of said M-bit serial bit pattern that has been programmed in said shift register into alignment with said M-bit serial bit pattern in said digital bit stream.

27. A method according to claim 26, wherein step (a) further comprises selectively preventing a respective shift clock signal from being supplied to said shift register, in accordance with whether a respective bit of said digital bit stream is a framing bit that does not form part of said M-bit serial bit pattern.

28. A method according to claim 20, wherein step (e) comprises successively incrementing said variable count by said count signals generated in step (d), as long as respective bits of said digital bit stream continue to match successive bits of said M-bit pattern being circulated through said shift register, and wherein step (f) comprises, in response to said variable count reaching the value of said programmable pattern match rate, generating said output representative of detection of said M-bit serial bit pattern.

* * * * *